(12) United States Patent
Chen et al.

(10) Patent No.: US 9,504,181 B2
(45) Date of Patent: Nov. 22, 2016

(54) SLIDE RAIL ASSEMBLY

(71) Applicants: KING SLIDE WORKS CO., LTD., KAOHSIUNG (TW); KING SLIDE TECHNOLOGY CO., LTD., KAOHSIUNG (TW)

(72) Inventors: Ken-Ching Chen, Kaohsiung (TW); Shun-Ho Yang, Kaohsiung (TW); Chien-Li Huang, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 13 days.

(21) Appl. No.: 14/662,544

(22) Filed: Mar. 19, 2015

(65) Prior Publication Data
US 2016/0278232 A1    Sep. 22, 2016

(51) Int. Cl.
| | | |
|---|---|---|
| A47B 63/00 | (2006.01) | |
| A47F 5/00 | (2006.01) | |
| H05K 7/14 | (2006.01) | |
| A47B 96/06 | (2006.01) | |
| A47B 96/07 | (2006.01) | |
| F16B 7/10 | (2006.01) | |
| A47B 88/04 | (2006.01) | |

(52) U.S. Cl.
CPC .......... *H05K 7/1489* (2013.01); *A47B 88/044* (2013.01); *A47B 96/061* (2013.01); *A47B 96/07* (2013.01); *F16B 7/10* (2013.01)

(58) Field of Classification Search
CPC .............. H05K 7/1489; A47B 88/044; A47B 96/061; A47B 96/07; A47B 2088/0444; A47B 2210/010032; A47B 2210/0016; A47B 2210/007; A47B 2210/0059; F16B 7/10

USPC ........... 248/218.4; 312/334.46, 334.44, 333; 384/18, 21
See application file for complete search history.

(56) References Cited

U.S. PATENT DOCUMENTS

| | | | | |
|---|---|---|---|---|
| 5,472,272 A * | 12/1995 | Hoffman | ................ | A47B 88/10 312/334.11 |
| 6,230,903 B1 * | 5/2001 | Abbott | ................ | H05K 7/1421 211/190 |
| 6,854,816 B2 * | 2/2005 | Milligan | ............... | F16C 29/063 312/334.11 |
| 6,948,691 B2 * | 9/2005 | Brock | ................. | A47B 88/044 211/175 |
| 7,090,319 B2 * | 8/2006 | Milligan | ............... | A47B 88/16 312/334.44 |
| 7,178,888 B2 * | 2/2007 | Judge | ..................... | A47B 88/10 312/334.44 |
| 8,028,965 B2 * | 10/2011 | Chen | .................... | A47B 88/044 248/298.1 |
| 8,147,011 B2 * | 4/2012 | Chen | ...................... | F16C 29/04 312/333 |
| 9,144,173 B2 * | 9/2015 | Chen | ....................... | E05D 15/08 |
| 9,328,769 B1 * | 5/2016 | Chen | ...................... | F16C 29/005 |
| 2001/0040203 A1 * | 11/2001 | Brock | ................. | A47B 88/044 248/222.11 |
| 2014/0217049 A1 * | 8/2014 | Chen | ....................... | E05D 15/08 211/195 |

\* cited by examiner

*Primary Examiner* — Anita M King
(74) *Attorney, Agent, or Firm* — Rosenberg, Klein & Lee

(57) ABSTRACT

A slide rail assembly includes a first rail, a second rail movably connected to the first rail, a bracket base connected to the first rail, and a supporting base movably mounted to the bracket base. The supporting base includes a wall portion and at least one supporting portion transversely connected to the wall portion. The wall portion and the at least one supporting portion jointly define a supporting channel corresponding to a longitudinal channel defined by the first rail. The at least one supporting portion of the supporting base supports the second rail as the second rail is longitudinally displaced relative to the first rail and extends through the longitudinal channel of the first rail and the supporting channel of the supporting base.

7 Claims, 9 Drawing Sheets

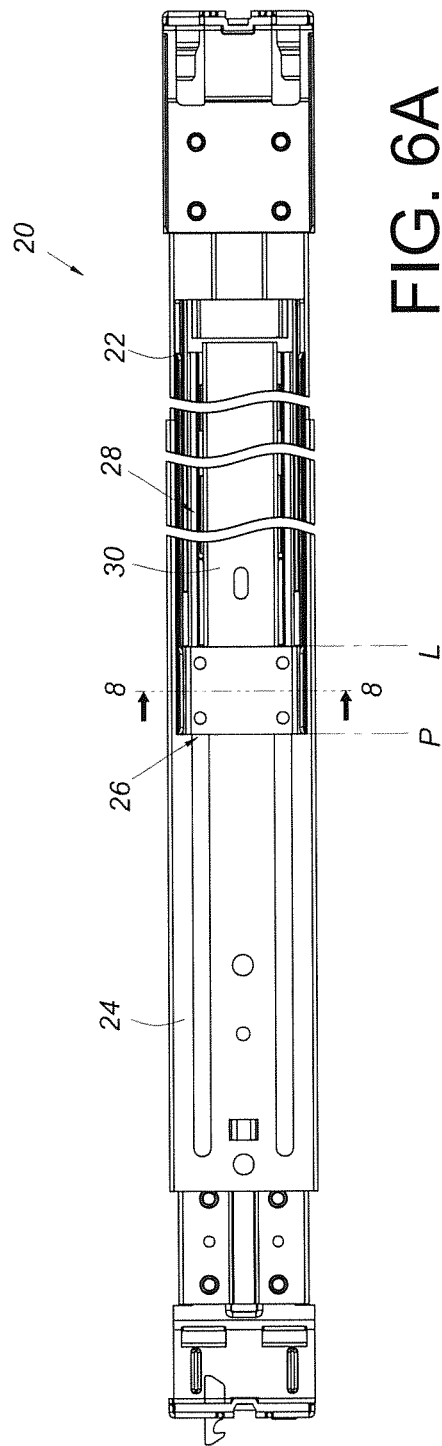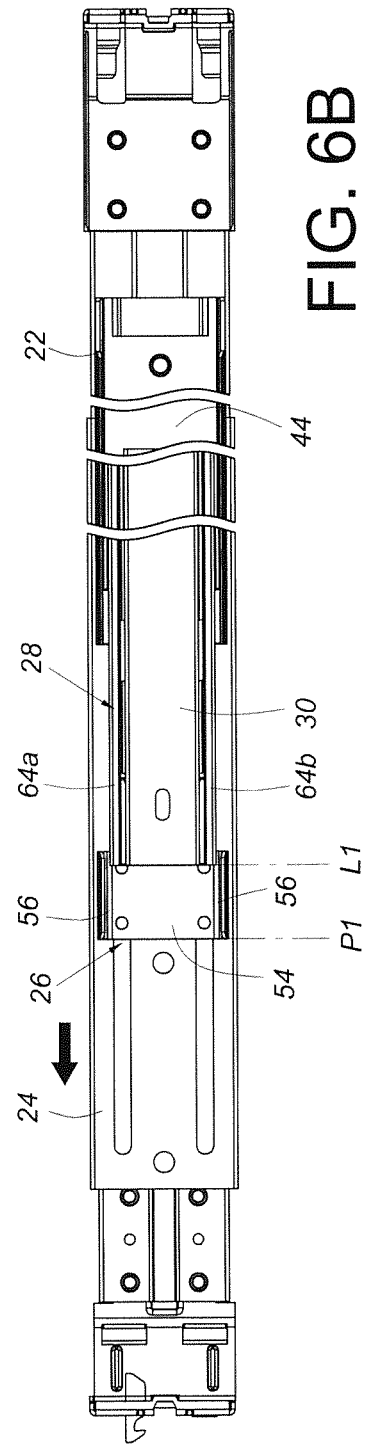

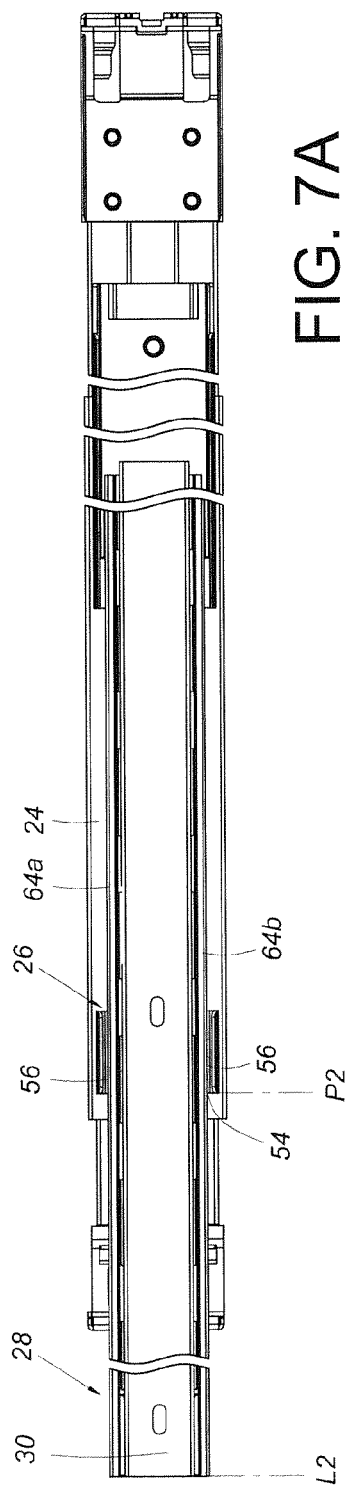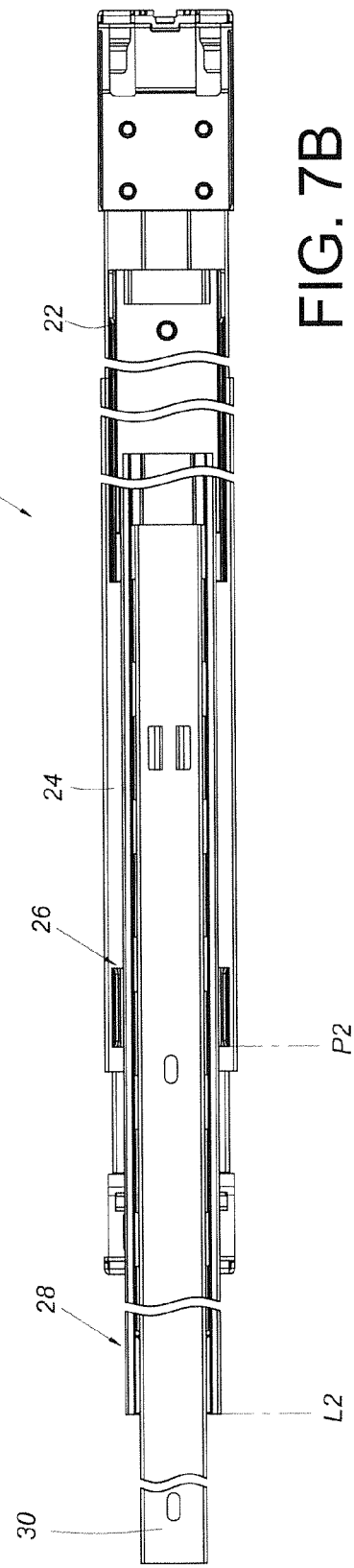

SLIDE RAIL ASSEMBLY

FIELD OF THE INVENTION

The present invention relates to a slide rail assembly and more particularly to a slide rail assembly which includes a first rail, a second rail movably connected to the first rail, and a supporting base for providing additional support for the second rail when the second rail is at an extended position relative to the first rail.

BACKGROUND OF THE INVENTION

Generally, a slide rail assembly in a rack-based server system serves to mount the chassis of a piece of electronic equipment to a rack. As shown in FIG. 1, a typical slide rail assembly 100 includes a first rail 102, a second rail 104, and a third rail 106. Each of the second rail 104 and the third rail 106 can be displaced relative to the first rail 102 so as to reach an extended position, thereby bringing the slide rail assembly 100 to an extended state. However, when the second rail 104 and the third rail 106 are at their respective extended positions relative to the first rail 102, a certain section 108 of the second rail 104 is left unsupported by the first rail 102. If the third rail 106 is to be mounted with the chassis of some electronic equipment, therefore, the load bearing capacity of the second rail 104 becomes an issue.

SUMMARY OF THE INVENTION

The present invention relates to a slide rail assembly including a supporting base for supporting a rail of the slide rail assembly.

According to one aspect of the present invention, a slide rail assembly includes a first rail, a second rail, a bracket base, and a supporting base. The first rail defines a longitudinal channel. The second rail is movably connected to the first rail and longitudinally displaceable relative to the first rail. The bracket base is connected to the first rail. The supporting base is movably mounted to the bracket base and includes a wall portion and at least one supporting portion transversely connected to the wall portion, wherein the wall portion and the at least one supporting portion jointly define a supporting channel corresponding to the longitudinal channel of the first rail. The second rail is allowed to displace into the supporting channel.

According to another aspect of the present invention, a slide rail assembly includes a first rail, a bracket base, a supporting base, and a second rail. The first rail includes an upper wall, a lower wall, and a sidewall connecting between the upper wall and the lower wall, wherein the upper wall, the lower wall, and the sidewall jointly define a longitudinal channel. The bracket base is connected to the sidewall of the first rail. The supporting base is movably mounted to the bracket base and includes a wall portion and at least one supporting portion transversely connected to the wall portion, wherein the wall portion and the at least one supporting portion jointly define a supporting channel corresponding to the longitudinal channel of the first rail. The second rail is movably connected to the first rail and can be longitudinally displaced relative to the first rail between a retracted position and an extended position. The second rail extends through the longitudinal channel of the first rail and the supporting channel of the supporting base and is supported by the at least one supporting portion of the supporting base during displacement relative to the first rail from the retracted position to the extended position.

According to still another aspect of the present invention, a slide rail assembly adapted to mount a chassis to a rack is provided, wherein the rack includes a first post and a second post. The slide rail assembly includes a first rail, a bracket base, a supporting base, a second rail, and a third rail. The first rail includes an upper wall, a lower wall, and a sidewall connecting between the upper wall and the lower wall, wherein the upper wall, the lower wall, and the sidewall jointly define a longitudinal channel. The bracket base is connected to the sidewall of the first rail and is mounted to the first post and the second post by a first bracket and a second bracket respectively. The supporting base is movably mounted to the bracket base and includes a wall portion and at least one supporting portion transversely connected to the wall portion, wherein the wall portion and the at least one supporting portion jointly define a supporting channel corresponding to the longitudinal channel of the first rail. The second rail is movably connected to the first rail and can be longitudinally displaced relative to the first rail so as to extend through the longitudinal channel of the first rail and the supporting channel of the supporting base and be supported by the at least one supporting portion of the supporting base. The third rail can be longitudinally displaced relative to the second rail and is mounted with the chassis. Preferably, the chassis includes a first portion and a second portion, the first portion has a greater width than the second portion, and the third rail is mounted to a lateral side of the second portion of the chassis.

In some embodiments of any of the above aspects, the bracket base further includes at least one longitudinal groove, and the slide rail assembly further includes at least one connecting element. Each of the at least one connecting element includes a head and a body connected to the head. The body of each of the at least one connecting element is passed through a corresponding one of the at least one longitudinal groove and is connected to the wall portion of the supporting base such that the head of each of the at least one connecting element is blocked on one side of the bracket base.

In some embodiments of any of the above aspects, the slide rail assembly further includes at least one supporting member corresponding to and mounted to the at least one supporting portion of the supporting base, and the second rail, once displaced into the supporting channel of the supporting base, is in contact with and supported by the at least one supporting member and displaces the supporting base relative to the bracket base by means of the contact.

In some embodiments of any of the above aspects, the supporting base includes a pair of the aforesaid supporting portions, which are transversely connected to one side of the wall portion at two positions respectively, and the supporting channel is defined jointly by the wall portion and the pair of supporting portions. Preferably, the second rail includes an upper wall, a lower wall, and a sidewall connecting between the upper wall and the lower wall, and the upper wall and the lower wall of the second rail correspond to the pair of supporting portions of the supporting base respectively when the second rail has been displaced into the supporting channel of the supporting base. Preferably, the slide rail assembly further includes a pair of supporting members mounted to the pair of supporting portions of the supporting base respectively, and while the second rail extends through the supporting channel of the supporting base, the upper wall and the lower wall of the second rail are in contact with the pair of supporting members respectively and displace the supporting base relative to the bracket base by means of the contact.

One of the advantageous features of applying the present invention is that the supporting base can provide additional support for the second rail when the second rail is at an extended position relative to the first rail.

BRIEF DESCRIPTION OF THE DRAWINGS

FIG. 6A shows the slide rail assembly in the first embodiment of the present invention in a retracted state in which the supporting base is at a predetermined position and the second rail, with respect to the first rail, is at a retracted position;

FIG. 6B shows that the second rail of the slide rail assembly in FIG. 6A has been longitudinally displaced relative to the first rail to a first extended position and therefore corresponds to and is supported by a portion of the supporting base;

FIG. 7A shows how the second rail of the slide rail assembly in the first embodiment of the present invention extends through the supporting channel of the supporting base and drives the supporting base to a second supporting position;

FIG. 7B shows that the third rail of the slide rail assembly in FIG. 7A can be further longitudinally displaced relative to the second rail to bring the slide rail assembly to a further extended state;

DETAILED DESCRIPTION OF THE INVENTION

Figure 1:
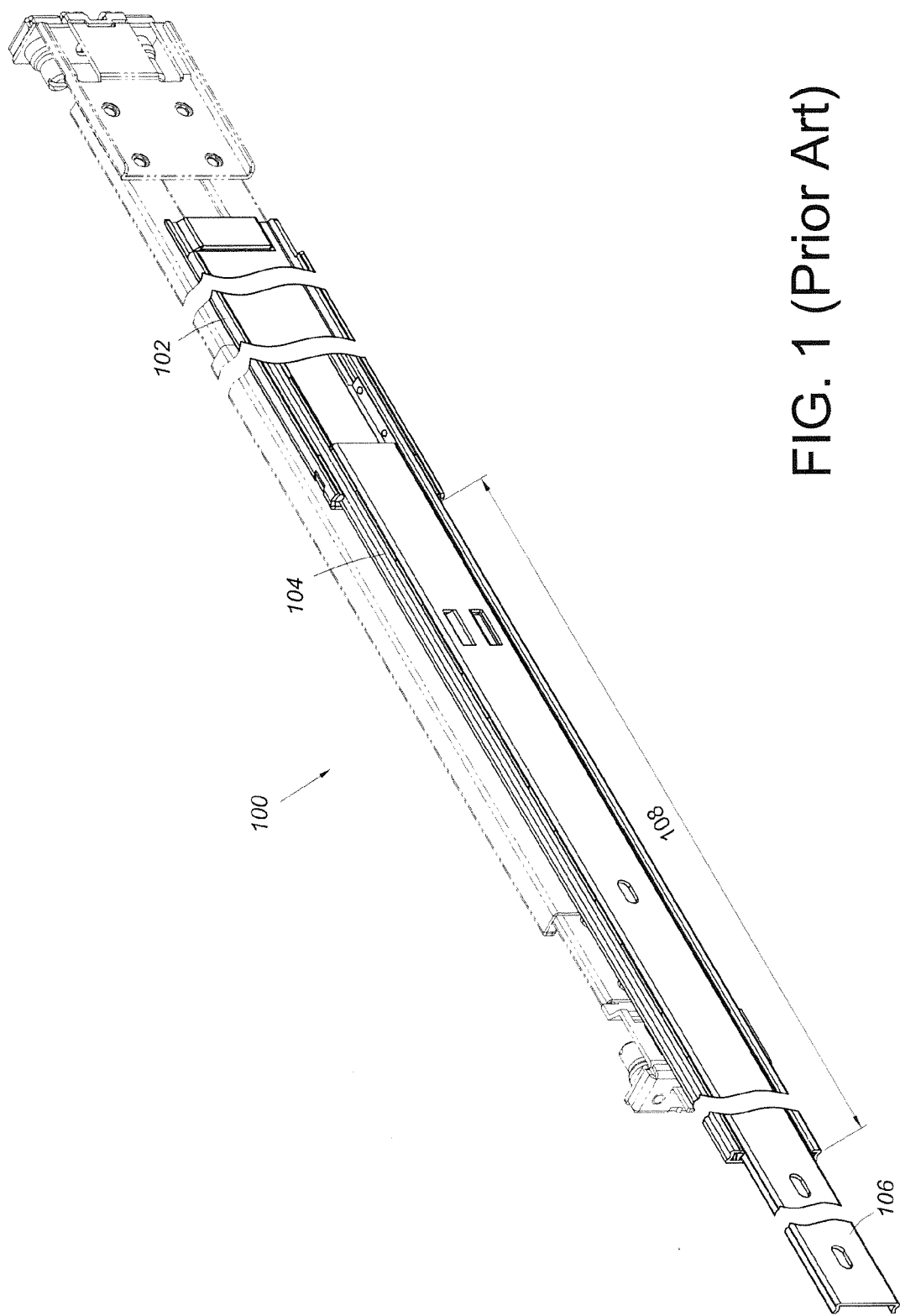
FIG. 1 is a perspective view of a conventional slide rail assembly in an extended state in which a certain section of the second rail is left unsupported by the first rail.
Figure 2:
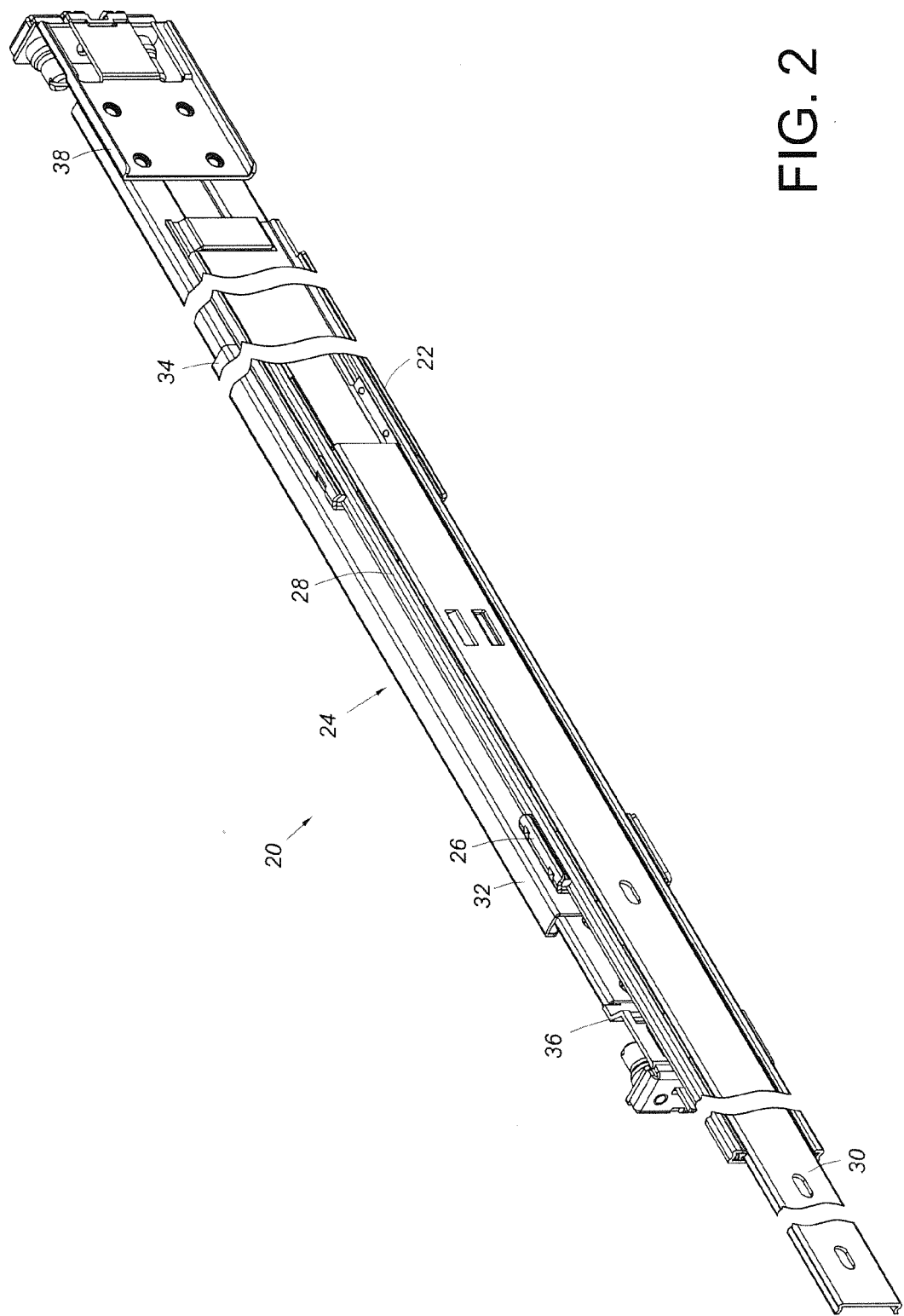
FIG. 2 is a perspective view of the slide rail assembly in a first embodiment of the present invention, wherein the slide rail assembly is in an extended state and the second rail is supported by the supporting base.

Referring to FIG. 2, the slide rail assembly 20 in the first embodiment of the present invention includes a first rail 22, a bracket base 24, a supporting base 26, a second rail 28, and a third rail 30. The bracket base 24 has a first end portion 32 and a second end portion 34 opposite the first end portion 32. The bracket base 24 is mounted with a first bracket 36 and a second bracket 38, which are adjacent to the first end portion 32 and the second end portion 34 respectively. For example, the first bracket 36 is mounted to the bracket base 24 at a position adjacent to the first end portion 32, and the second bracket 38 is mounted to the bracket base 24 at a position adjacent to the second end portion 34. The first rail 22, the second rail 28, and the third rail 30 are sequentially and longitudinally movably connected together and can be brought to an extended state.

Figure 3:
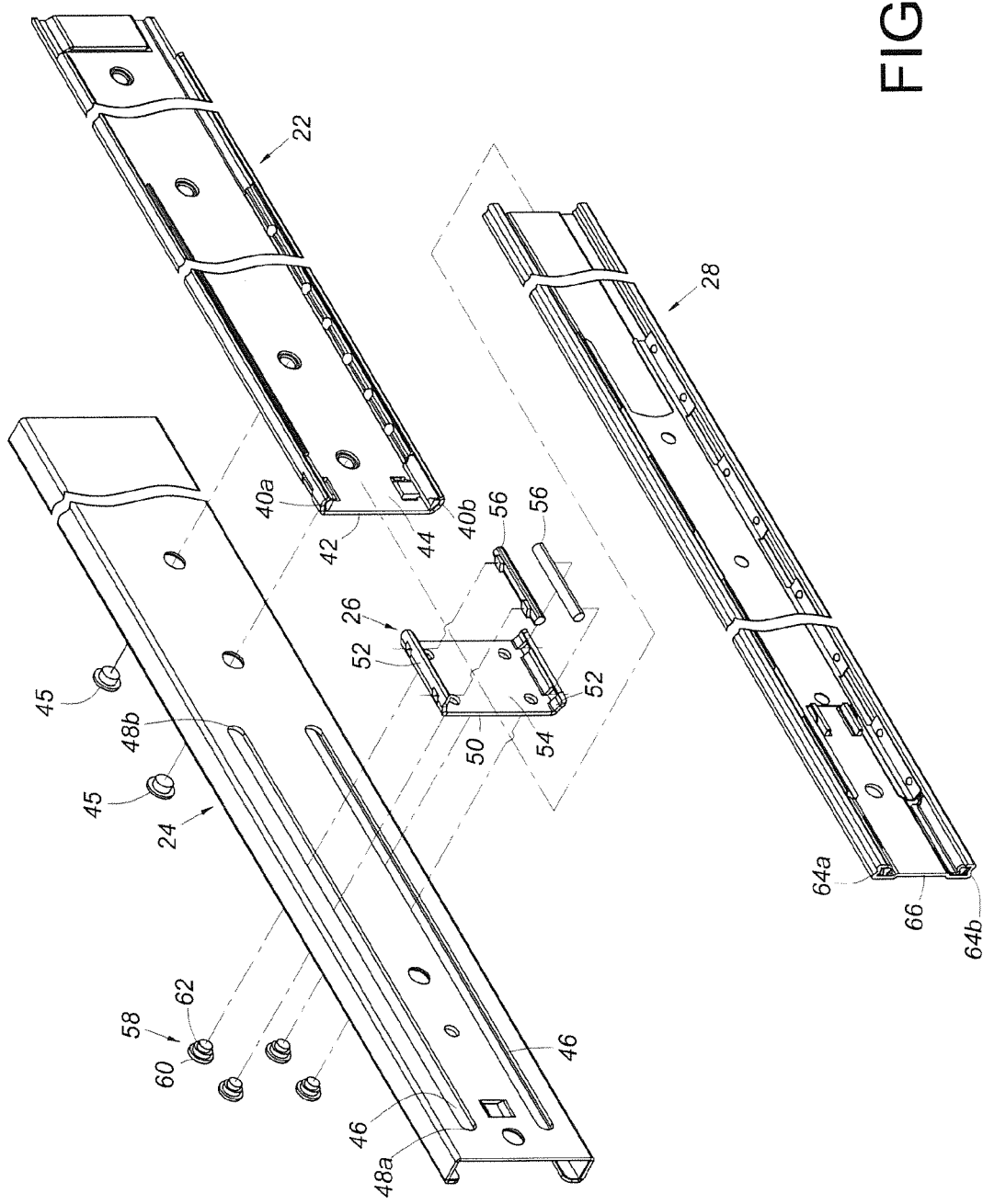
FIG. 3 is an exploded perspective view of the slide rail assembly in the first embodiment of the present invention.

As shown in FIG. 2 and FIG. 3, the first rail 22 includes an upper wall 40a, a lower wall 40b, and a sidewall 42 connecting between the upper wall 40a and the lower wall 40b. The upper wall 40a, the lower wall 40b, and the sidewall 42 jointly define a longitudinal channel 44.

The bracket base 24 is connected to the first rail 22. For instance, the bracket base 24 can be connected to the sidewall 42 of the first rail 22 by riveting, by threaded connection, by soldering, by corresponding engaging features, or the like. In this embodiment, riveting is carried out with rivets 45 by way of example. Alternatively, the bracket base 24 can be integrally formed with the sidewall 42 of the first rail 22 and, in that case, can be viewed as a part of the first rail 22. The present invention imposes no limitations on how the bracket base 24 is connected to the first rail 22. Preferably, the bracket base 24 includes at least one longitudinal groove 46. In this embodiment, two longitudinal grooves 46 are provided by way of example, and each longitudinal groove 46 is defined between a first blocking wall 48a and a second blocking wall 48b.

The supporting base 26 is movably mounted to the bracket base 24. The supporting base 26 includes a wall portion 50 and at least one supporting portion 52 transversely connected to the wall portion 50. Here, the supporting base 26 includes a pair of supporting portions 52 by way of example. The pair of supporting portions 52 are transversely connected to the same side of the wall portion 50 at two positions (e.g., an upper position and a lower position) respectively such that the supporting portions 52 correspond to each other. The wall portion 50 and the pair of supporting portions 52 jointly define a supporting channel 54 which corresponds to the longitudinal channel 44 of the first rail 22, and the second rail 28 is allowed to displace into the supporting channel 54. Preferably, a pair of supporting members 56 are mounted to the pair of supporting portions 52 of the supporting base 26 respectively. In practice, each of the supporting members 56 and each of the supporting portions 52 may be provided with corresponding structural features (e.g., corresponding projections and holes) to facilitate assembly, or at least one additional connecting element is used for the assembly. The present invention has no limitations in this regard. The supporting base 26 is movably mounted to the bracket base 24 by at least one connecting element 58. For example, each longitudinal groove 46 is mounted with two connecting elements 58, and each connecting element 58 includes a head 60 and a body 62 connected to the head 60, with the head 60 larger than the body 62 in diameter. The body 62 of each connecting element 58 is passed through the corresponding longitudinal groove 46 of the bracket base 24 and connected to the wall portion 50 of the supporting base 26 such that the head 60 of each connecting element 58 is blocked on one side of the bracket base 24. The foregoing arrangement allows the supporting base 26 to be displaced relative to the bracket base 24 within a range defined by the length of the longitudinal grooves 46.

The second rail 28 is movably connected to the first rail 22 and is located in the longitudinal channel 44. The second rail 28 includes an upper wall 64a, a lower wall 64b, and a sidewall 66 connecting between the upper wall 64a and the lower wall 64b.

Figure 4:
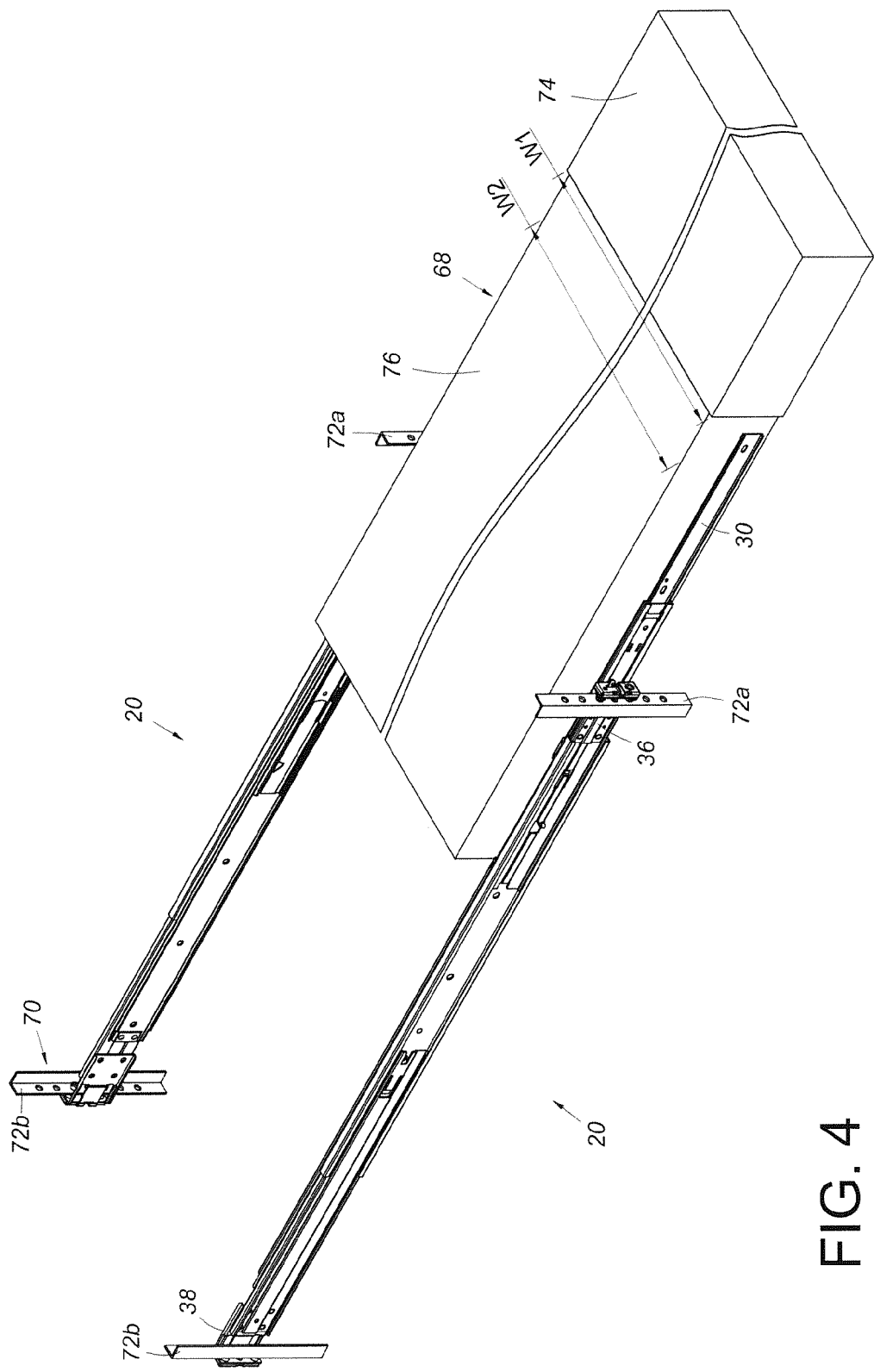
FIG. 4 shows how the slide rail assembly in the first embodiment of the present invention is used to mount a chassis to a rack, the slide rail assemblies shown being in an extended state.

FIG. 4 shows how a chassis 68 is mounted to a rack 70 via a pair of slide rail assemblies 20. The rack 70 includes two pairs of posts, e.g., two corresponding first posts 72a and two corresponding second posts 72b. Each slide rail assembly 20 has two portions (e.g., a front portion and a rear portion) mounted to one first post 72a and one second post 72b of the rack 70 via the first bracket 36 and the second bracket 38 respectively in order to mount the chassis 68 to the rack 70. More specifically, the chassis 68 is mounted to the third rails 30 of the slide rail assemblies 20. In this embodiment, the chassis 68 is a generally T-shaped chassis. For example, the chassis 68 includes a first portion 74 and a second portion 76. The first portion 74 has a first width W1, and the second portion 76 has a second width W2, wherein the first width W1 is greater than the second width W2.

Figure 5A:
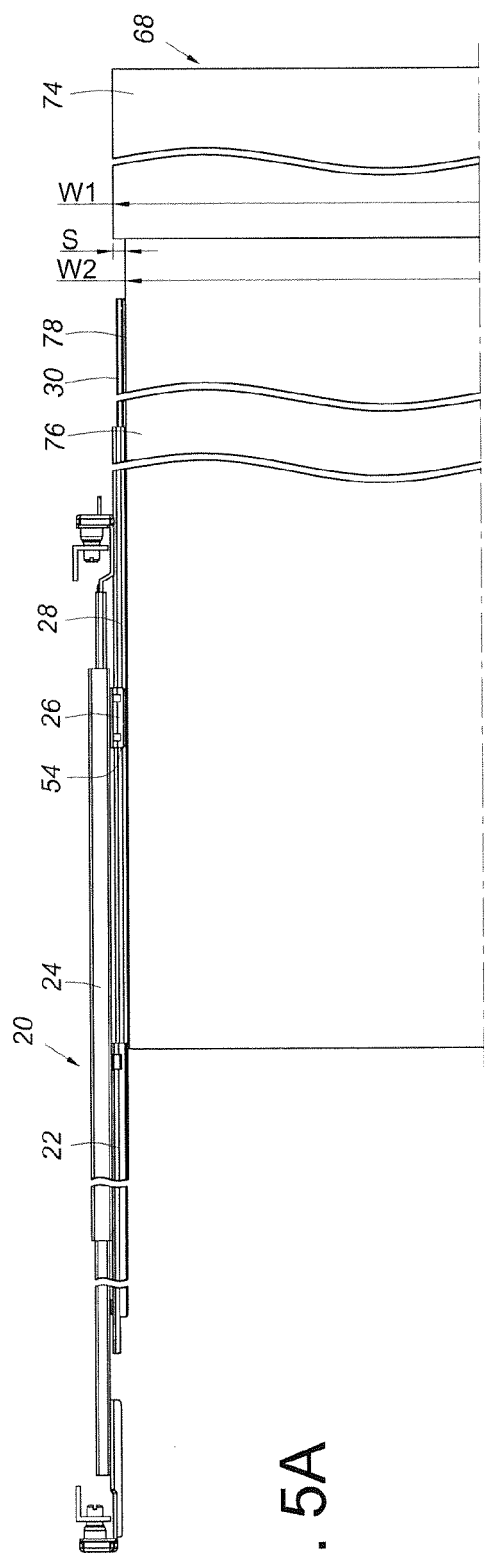
FIG. 5A shows the slide rail assembly in the first embodiment of the present invention in an extended state, with the third rail mounted to the second portion of a chassis.
Figure 5B:
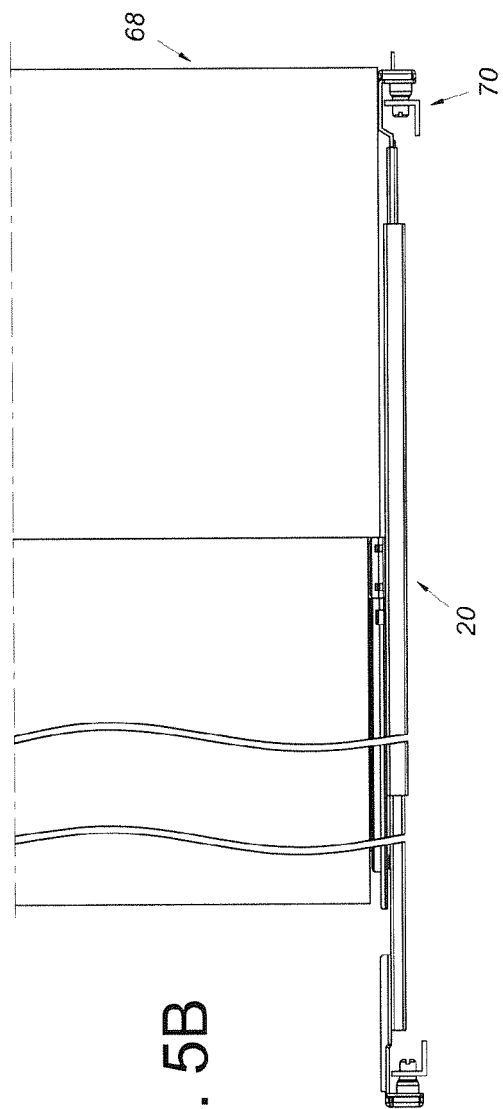
FIG. 5B shows the slide rail assembly in the first embodiment of the present invention in a retracted state, and how a chassis mounted to the slide rail assembly is received in a rack.

In FIG. 5A, the slide rail assembly 20 is in an extended state. As the width W1 of the first portion 74 of the chassis 68 is greater than the width W2 of the second portion 76 of the chassis 68, the first portion 74 has an extra width S in comparison with the second portion 76. Because of that, the third rail 30 of the slide rail assembly 20 cannot but be mounted to a lateral side 78 of only the second portion 76 of the chassis 68. When the slide rail assembly 20 is in the extended state, therefore, it is all the more necessary that the weight of the chassis 68 acting on the third rail 30 be shared by other components of the slide rail assembly 20, such as the second rail 28. In the course in which the second rail 28 is pulled out relative to the first rail 22 toward an extended position, the second rail 28 extends through the supporting channel 54 of the supporting base 26 in order for the supporting base 26, which is movably connected to the bracket base 24, to provide additional support to the second rail 28, thereby enabling the second rail 28 to hold out against the weight of the chassis 68 acting on the third rail 30. In FIG. 5B, the slide rail assembly 20 is in a retracted state in which the entire chassis 68 is received in the rack 70.

The slide rail assembly 20 in FIG. 6A is in the retracted state, meaning the second rail 28 and the third rail 30 have both been retracted with respect to the first rail 22. In this state, the supporting base 26 can be adjusted relative to the bracket base 24 to a predetermined position P if necessary, and the second rail 28 can be located at a retracted position L relative to the first rail 22.

Referring to FIG. 6B, the third rail 30 is pulled out relative to the first rail 22 in an extending direction (indicated by the arrow) such that the second rail 28 is driven by the third rail 30 and hence longitudinally displaced relative to the first rail 22 from the retracted position L to a first extended position L1. More specifically, in the course in which the second rail 28 is displaced, a portion of the second rail 28 juts out of the longitudinal channel 44 of the first rail 22 and is longitudinally displaced relative to the first rail 22 into the supporting channel 54 of the supporting base 26. Consequently, the upper wall 64a and the lower wall 64b of the second rail 28 correspond to, for example, the pair of supporting members 56 of the supporting base 26 respectively. In addition, by means of friction, the second rail 28 drives the supporting base 26 from the predetermined position P to a first supporting position P1 relative to the bracket base 24, allowing a portion of each of the supporting members 56 to support the corresponding one of the upper wall 64a and the lower wall 64b of the second rail 28. It is worth mentioning that the supporting members 56 in use can be so chosen that they have the appropriate thicknesses for dealing with or compensating for support errors, if any. The goal is to ensure that each supporting member 56 can support the second rail 28 effectively.

Referring to FIG. 7A, when the second rail 28 is further driven by the third rail 30 to a second extended position L2, the second rail 28 not only extends through the supporting channel 54 of the supporting base 26, but further drives the supporting base 26, by friction, from the first supporting position P1 to a second supporting position P2 relative to the bracket base 24, in order for the pair of supporting members 56 of the supporting base 26 to support, in their entirety, the upper wall 64a and the lower wall 64b of the second rail 28 respectively.

Referring to FIG. 7B, when the second rail 28 is at the second extended position L2 (e.g., when the second rail 28 has been extended to the greatest extent possible), the third rail 30 can be further pulled out and hence longitudinally displaced relative to the second rail 28, thereby bringing the slide rail assembly 20 to a further extended state.

It can be known from the above that, once displaced relative to the first rail 22 into the supporting channel 54 of the supporting base 26, the second rail 28 is supported by the supporting base 26. Therefore, if the third rail 30 is mounted with the chassis 68 shown in FIG. 4, the supporting base 26 will be able to support the second rail 28 and allow the second rail 28 to effectively share the weight of the chassis 68. It should be pointed out that, although the supporting base 26 can be frictionally driven into displacement by the second rail 28 while the second rail 28 is being pulled out relative to the first rail 22 toward an extended position, the slide rail assembly 20 can be so designed that the second rail 28 directly passes through the supporting channel 54 of the supporting base 26, and that the supporting base 26 can be manually adjusted to a proper supporting position in order to support the second rail 28 and thereby satisfy the practical need for support.

Figure 8:
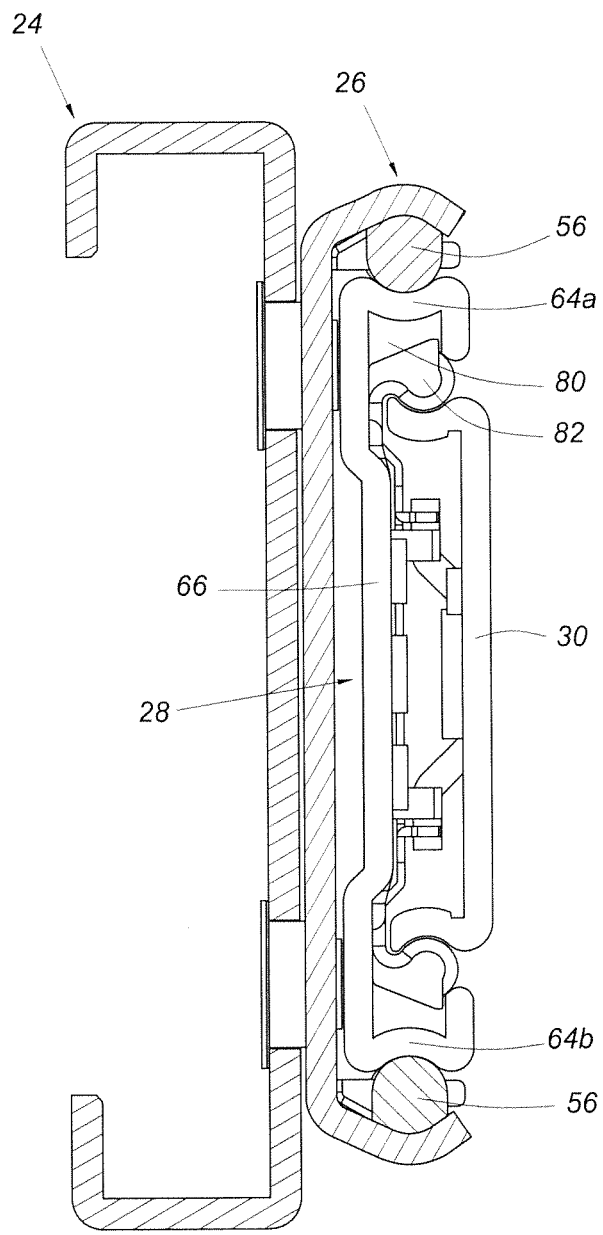
FIG. 8 is a sectional view taken along line 8-8 in FIG. 6A, showing how the supporting members support the second rail.

FIG. 8 further illustrates the arrangement of the bracket base 24, the supporting base 26, and the second rail 28. More specifically, the upper wall 64a, the lower wall 64b, and the sidewall 66 of the second rail 28 jointly define a longitudinal channel 80 in which the third rail 30 is mounted. For example, the longitudinal channel 80 is mounted therein with a slide facilitating member 82 to facilitate displacement of the third rail 30 relative to the second rail 28. The supporting base 26 is movably mounted to the bracket base 24, and the pair of supporting members 56 of the supporting base 26 can be brought into contact with the upper wall 64a and the lower wall 64b of the second rail 28 respectively so as to support the second rail 28.

Figure 9:
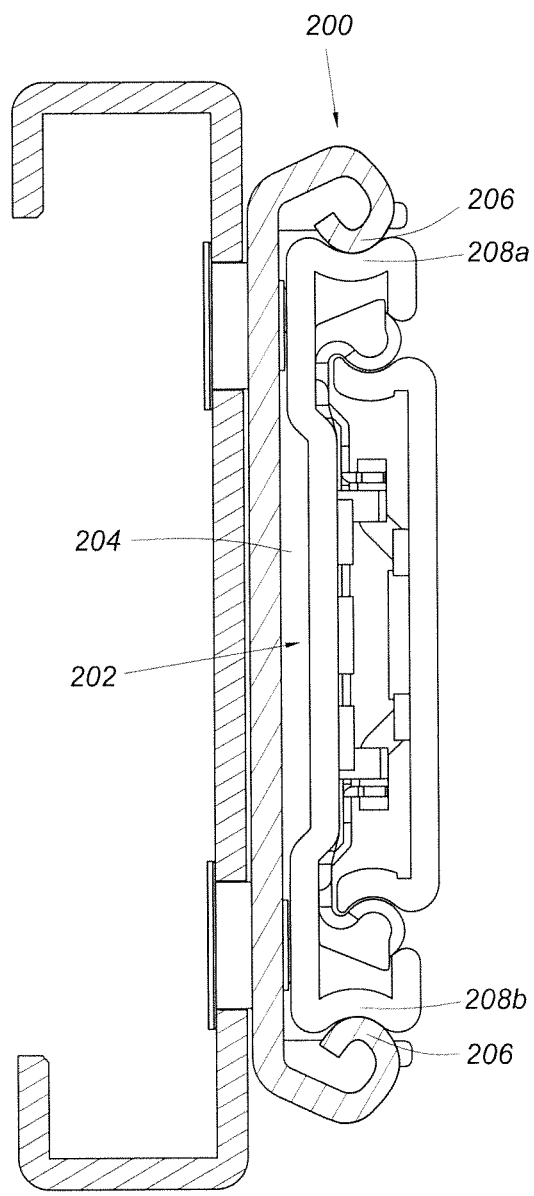
FIG. 9 shows the slide rail assembly in a second embodiment of the present invention.

Please refer to FIG. 9 for the slide rail assembly in the second embodiment of the present invention, with particular attention to the supporting base 200. The supporting base 200 in this embodiment is different from its counterpart in the first embodiment generally in that, when the second rail 202 passes through the supporting channel 204 of the supporting base 200, the pair of supporting portions 206 of the supporting base 200 support the second rail 202 through respective direct contact with the upper wall 208a and the lower wall 208b of the second rail 202.

While the present invention has been disclosed through the foregoing preferred embodiments, the embodiments described above are not intended to be restrictive of the present invention. The scope of patent protection sought by the applicant is defined by the appended claims.

The invention claimed is:
1. A slide rail assembly, comprising:
a first rail defining a longitudinal channel;
a second rail movably connected to the first rail and longitudinally displaceable relative to the first rail;
a bracket base connected to the first rail and including at least one longitudinal groove;

a supporting base movably mounted to the bracket base, the supporting base including a wall portion and at least one supporting portion transversely connected to the wall portion, wherein the wall portion and the at least one supporting portion jointly define a supporting channel corresponding to the longitudinal channel of the first rail, and the second rail is allowed to displace into the supporting channel; and at least one connecting element, the at least one connecting element including a head and a body connected to the head, the body of the at least one connecting element extending through the at least one longitudinal groove and being connected to the wall portion of the supporting base such that the head of the at least one connecting element is blocked on one side of the bracket base.

2. The slide rail assembly of claim 1, further wherein the supporting base further includes a pair of supporting portions, which are transversely connected to one side of the wall portion at two positions respectively, and the wall portion and the pair of supporting portions jointly define the supporting channel.

3. The slide rail assembly of claim 2, wherein the second rail includes an upper wall, a lower wall, and a sidewall connecting between the upper wall and the lower wall, and the upper wall and the lower wall of the second rail correspond to the pair of supporting portions of the supporting base respectively when the second rail has been displaced into the supporting channel of the supporting base.

4. A slide rail assembly, comprising:
a first rail defining a longitudinal channel;
a second rail movably connected to the first rail and longitudinally displaceable relative to the first rail;
a bracket base connected to the first rail;
a supporting base movably mounted to the bracket base, the supporting base including a wall portion and at least one supporting portion transversely connected to the wall portion, wherein the wall portion and the at least one supporting portion jointly define a supporting channel corresponding to the longitudinal channel of the first rail, and the second rail is allowed to displace into the supporting channel; and
at least one supporting member corresponding to and mounted to the at least one supporting portion of the supporting base, wherein the second rail, once displaced into the supporting channel of the supporting base, is in contact with and supported by the at least one supporting member and, through said contact, drives the supporting base into displacement relative to the bracket base.

5. A slide rail assembly, comprising:
a first rail including an upper wall, a lower wall, and a sidewall connecting between the upper wall and the lower wall, wherein the upper wall, the lower wall, and the sidewall jointly define a longitudinal channel;
a bracket base connected to the sidewall of the first rail;
a supporting base movably mounted to the bracket base, the supporting base including a wall portion and at least one supporting portion transversely connected to the wall portion, wherein the wall portion and the at least one supporting portion jointly define a supporting channel corresponding to the longitudinal channel of the first rail, the supporting base further including a pair of supporting portions which are transversely connected to one side of the wall portion at two positions respectively; the wall portion and the pair of supporting portions jointly defining the supporting channel;
a second rail movably connected to the first rail and longitudinally displaceable relative to the first rail between a retracted position and an extended position, the second rail including an upper wall, a lower wall, and a sidewall connecting between the upper wall and the lower wall; and the upper wall and the lower wall of the second rail correspond to the pair of supporting portions of the supporting base respectively while the second rail extends through the supporting channel of the supporting base; and
a pair of supporting members mounted to the pair of supporting portions of the supporting base respectively;
wherein the second rail extends through the longitudinal channel of the first rail and the supporting channel of the supporting base and is supported by the at least one supporting portion of the supporting base while being displaced relative to the first rail from the retracted position to the extended position, and while the second rail extends through the supporting channel of the supporting base, the upper wall and the lower wall of the second rail are in contact with the pair of supporting members respectively and, through said contact, drive the supporting base into displacement relative to the bracket base.

6. A slide rail assembly adapted to mount a chassis to a rack, the rack including a first post and a second post, the slide rail assembly comprising:
a first rail including an upper wall, a lower wall, and a sidewall connecting between the upper wall and the lower wall, wherein the upper wall, the lower wall, and the sidewall jointly define a longitudinal channel;
a bracket base connected to the sidewall of the first rail, the bracket base being mounted to the first post and the second post by a first bracket and a second bracket respectively;
a supporting base movably mounted to the bracket base, the supporting base including a wall portion and at least one supporting portion transversely connected to the wall portion, wherein the wall portion and the at least one supporting portion jointly define a supporting channel corresponding to the longitudinal channel of the first rail;
a second rail movably connected to the first rail and longitudinally displaceable relative to the first rail so as to extend through the longitudinal channel of the first rail and the supporting channel of the supporting base and be supported by the at least one supporting portion of the supporting base; and
a third rail longitudinally displaceable relative to the second rail and mounted with the chassis.

7. The slide rail assembly of claim 6, wherein the chassis includes a first portion and a second portion, the first portion has a greater width than the second portion, and the third rail is mounted to a lateral side of the second portion of the chassis.

* * * * *